United States Patent [19]

Choon et al.

[11] Patent Number: 5,608,188
[45] Date of Patent: Mar. 4, 1997

[54] MULTI COMPARTMENT ELECTROMAGNETIC ENERGY SHIELD

[75] Inventors: Low P. Choon, Richmond; Chan Y. Kwong, Surrey, both of Canada

[73] Assignee: Motorola, Inc., Schaumburg, Ill.

[21] Appl. No.: 300,613

[22] Filed: Sep. 2, 1994

[51] Int. Cl.$^6$ ..................................................... H05K 9/00
[52] U.S. Cl. ....................................................... 174/35 R
[58] Field of Search ........................... 174/35 GC, 35 R; 361/816, 818, 800

[56] References Cited

U.S. PATENT DOCUMENTS

| | | | |
|---|---|---|---|
| 4,370,515 | 1/1983 | Donaldson | 174/35 R |
| 5,160,807 | 11/1992 | Fry et al. | 174/35 R |
| 5,354,951 | 10/1994 | Lange, Sr. et al. | 174/35 R |
| 5,414,597 | 5/1994 | Lindland et al. | 361/816 |
| 5,416,668 | 5/1995 | Benzoni | 361/816 |

*Primary Examiner*—Bot L. Ledynh
*Attorney, Agent, or Firm*—Charles W. Bethards; Kevin A. Buford

[57] ABSTRACT

A multi compartment electromagnetic energy shield (100) arranged for assembly to a mounting surface (203) of a carrier (201), the multi compartment electromagnetic energy shield includes an enclosure (101) and a partition (103) having electromagnetic shielding properties. The enclosure includes a first surface (405) and a first and a second side wall (105, 107) each extending from the first surface (405) to the mounting surface (203) of the carrier (201) after the assembly to the mounting surface of the carrier. The partition (103) including a mounting edge (305) and being arranged and constructed to electromagnetically divide the enclosure into multiple compartments (111, 113). The partition further captivated by the first and the second side wall (105, 107) in a free floating manner such that the mounting edge coincides with the mounting surface (203) after assembly to the mounting surface of the carrier (201).

12 Claims, 3 Drawing Sheets

MULTI COMPARTMENT ELECTROMAGNETIC ENERGY SHIELD

FIELD OF THE INVENTION

Generally the instant disclosure concerns an electromagnetic shield and more particularly but not limited to such a shield having multiple compartments and improved assembly characteristics.

BACKGROUND OF THE INVENTION

Electromagnetic shields are known. The problems encountered in an assembly environment are also known. The importance of such shields and the severity of the assembly problems have increased with the relatively recent reduction in the physical size of underlying electronic assemblies that rely on such shields and the move to and acceptance of automated surface mount technology for such assemblies. With the advent of reduced size automated surface mount technology the electromagnetic shield is now required to meet stringent coplanarity specifications, occupy a minimum amount of physical space, be assembly efficient, and of course economically effective.

Reduced size goals for the assembly mandates minimizing the size of all components and the space between components as well as minimizing part counts. As a result of these space reductions the degree of shielding required may have increased since circuits and components that historically did not need to be isolated may now have to be in order to operate satisfactorily. This coupled with the historical fact that electromagnetic shields are among the larger components in an assembly has caused practitioners to direct significant attention to reducing the effective size of such shields. Assembly efficiency ordinarily mandates minimal part counts with 1 component being favored over 2 components, etc. In addition automated assembly requires a regular shaped component that is easily and repetitively handled by mechanically actuated assembly arms and this favors relatively regular exterior surfaces with a minimal amount of assembly motion directed to orientation.

The coplanarity requirements are derived from the fact that usually the assembly has a carrier, typically a printed circuit board, with a planer surface on which the various components are placed during assembly. Assembly usually includes placing the component on the planer surface in contact with a small amount of solder paste which is subsequently reflowed thus securing the component to the planer surface when the solder re-solidifies. The coplanarity specification intends to specify the extent to which the mounting surface of a given component complies with or corresponds to the planer surface to which it will be assembled. Minor deviations from the specification may result in major, probably fatal, flaws in the quality and integrity of the final assembly since the component will not be adequately secured to the planer surface.

It is known to use electromagnetic shields that resemble an open sided box. Careful control of the manufacturing process results in a shield that satisfies realistic coplanarity specifications. If multiple items need to be shielded, two shields can be employed however this may result in excess physical space being used as well as multiple piece parts. A single piece shield could be constructed that has a soldered or spot welded partition however such a shield while minimizing parts count has proven to be extremely difficult and thus costly to manufacturer in sufficient quantity and in compliance with reasonable coplanarity specifications.

Clearly a need exists for a cost effective electromagnetic shield that complies with required coplanarity specifications and lends itself to reduced size automated surface mount assembly operations.

BRIEF DESCRIPTION OF THE DRAWINGS

The features of the present invention which are believed to be novel are set forth with particularity in the appended claims. However, the invention together with further advantages thereof, may best be understood by reference to the accompanying drawings wherein:

DETAILED DESCRIPTION OF A PREFERRED EMBODIMENT

Generally this disclosure deals with an electromagnetic shield and more particularly a multi compartment shield particularly adapted for improved coplanarity to aid in low cost, surface mount, high density assembly processes. This shield includes an enclosure together with a partition that is captivated in a free floating fashion.

Figure 1:
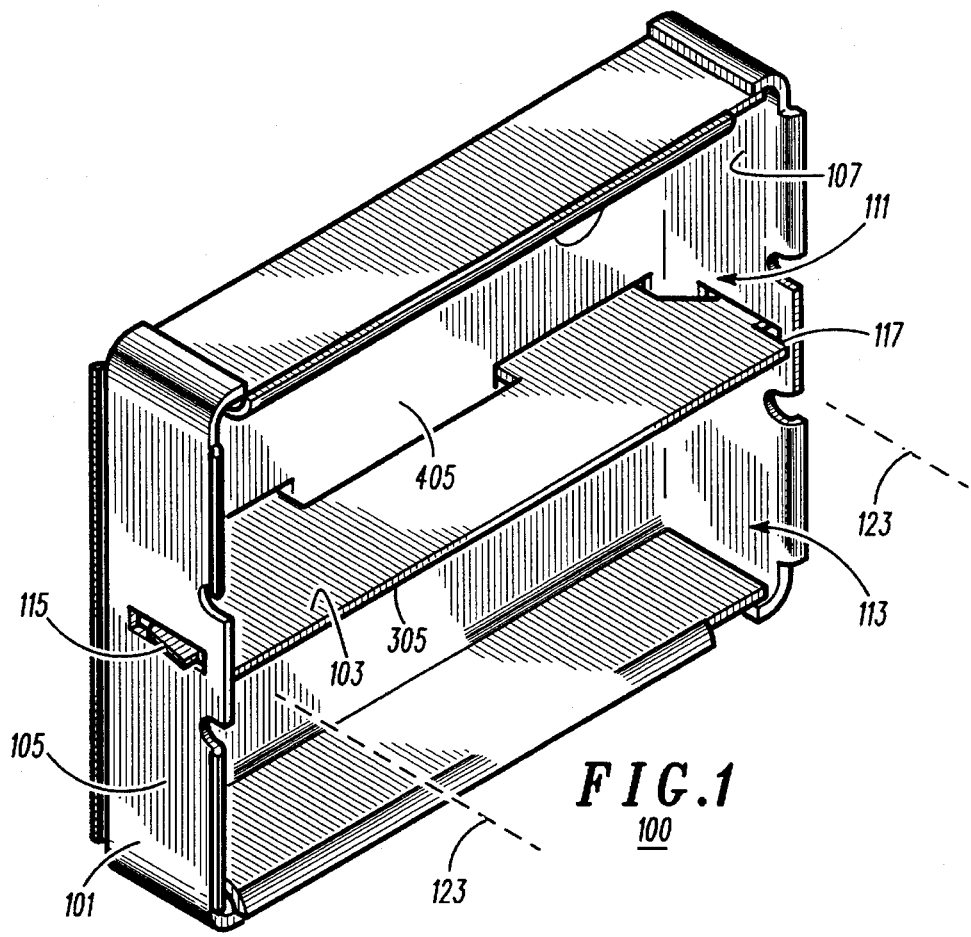
FIG. 1 is a rotational diagram of an electromagnetic shield in accordance with the instant invention.
Figure 2:
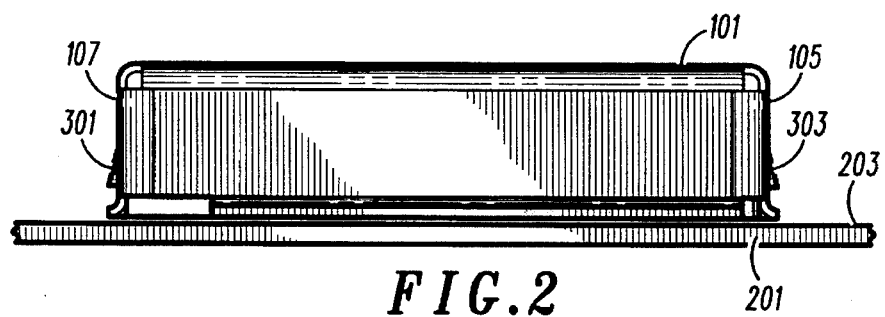
FIG. 2 is a diagram of the FIG. 1 shield as assembled to a carrier.

A preferred embodiment in accordance with the instant invention is an electromagnetic shield, such as a multi compartment electromagnetic energy shield, that is arranged for assembly to a mounting surface (203) of a carrier (201) as shown in FIG. 2. The mounting surface (203) has a predetermined configuration, such as a planer surface, and the shield (100) preferably has improved coplanarity properties. This shield (100) depicted in a preferred form in FIG. 1, includes an enclosure (101) and a partition (103), with each having electromagnetic shielding properties, such as preferably provided by a metallic material like half hard 0.2 millimeters (mm) thick pre-tinned brass. The following description refers to various of the FIG.'s 1 through 5.3 wherein like elements have like reference numerals.

The enclosure (101), depicted in additional detail in FIG. 4 and FIGS. 5A–5D et sequence, further includes a first surface or closed side (405) and a plurality of walls (501) each extending from the first surface (405) and culminating at a corresponding plurality of mounting edges (503) to collectively form a mounting plane (505) that is substantially coincident with the mounting surface (203), preferably planer surface, of the carrier (201) during and after assembly of the electromagnetic shield (101) to the carrier (201) via a reflow assembly process. More particularly a first side wall (105) and a second side wall (107) each extend from the first surface (405) to the mounting surface (203) of the carrier during and after assembly. The first and second side walls (105, 107), respectively, include a first and second captivating slot (115, 117) and the first surface includes a first and second locating slot (407, 409).

Figure 3:
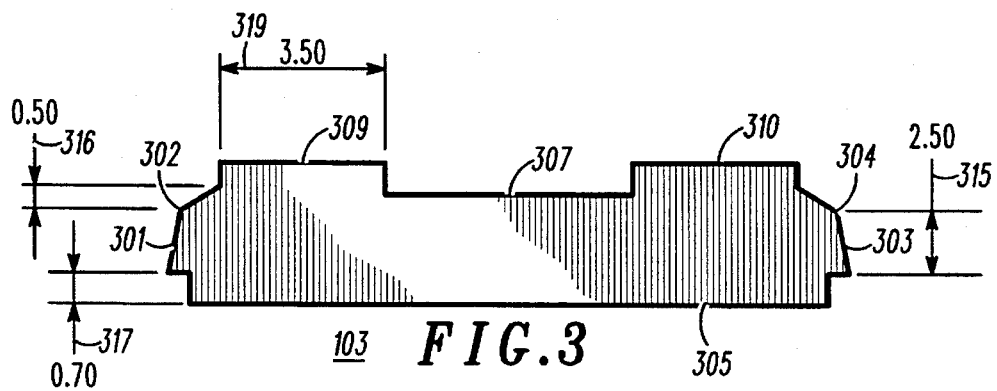
FIG. 3 is a diagram of a preferred embodiment of the partition depicted in FIG. 1.

The partition (103), depicted in further detail in FIG. 3, includes a mounting edge or edge (305), a captivating mechanism or tabs, preferably, a first tab (301) with a leading surface (302) and a second tab (303) with a leading surface (304), a dividing edge (307), and a first and second locating tab (309, 310). The partition (103) is arranged and constructed to electromagnetically divide the enclosure (101) into multiple compartments, such as a first compartment (111) and a second compartment (113) when the partition (103) is captivated by the first and the second side wall (105, 107) in a free floating manner such that the mounting edge coincides with the mounting surface (203) after assembly of the electromagnetic shield to the mounting surface of the carrier (201). More specifically, the first and second tabs (301, 303) are captivated within the first and second captivating slots (115, 117) at the same time that the first and second locating tabs (309, 310) are inserted in the first and second locating slots (407, 409).

The free floating captivation feature is accomplished by providing all slots with dimensions that are relatively larger than the corresponding tabs. For example the dimensions (507, 509) of the first and the second captivating slots (115, 117) are each 0.5 mm in width by 1.8 mm in length while the corresponding tab is 0.2 mm in width and (2.5−0.5−0.7)=1.3 mm in length (315–316–317). Similarly, the dimensions (511, 513) of the locating slots (407, 409) are 0.6 mm in width by 3.75 mm in length and the corresponding locating tabs are 0.2 mm in width by 3.5 mm in length (319). These dimensions together with the other locating dimensions for the tabs and corresponding slots depicted in FIG. 3 and FIGS. 5A–5D allow the partition (103) to free float in a captivated fashion after assembly to the enclosure (101). Additionally, a comparison of the 0.7 mm dimension (317) with the 0.55 mm dimension of FIG. 5C shows that the mounting edge (305) of the partition (103) will coincide with the mounting surface of the carrier (201) during assembly presuming the presence of gravity and an assembly orientation such as depicted in FIG. 2.

The enclosure (101) and the partition (103) are fabricated from the 0.2 mm material using a stamping and, in the case of the enclosure (101), subsequent forming operations as are known in the art. After fabrication of the enclosure (101) and the partition (103) these parts are assembled into the shield (100) by orienting the partition (103) with the dividing edge (307) nearest the first surface (405) of the enclosure (101) and moving the partition toward the first surface along the lines of assembly (123) until the first and second tabs (301, 303) are engaged within the first and second captivating slots (115, 117). During this assembly stage the leading surfaces (302, 304) of the first and second tabs (301, 303) will contact the first and the second side wall (105, 107) and likely cause some temporary, within the modulus of elasticity, flexing or distortion of the first and second side walls (105, 107).

Figure 4:
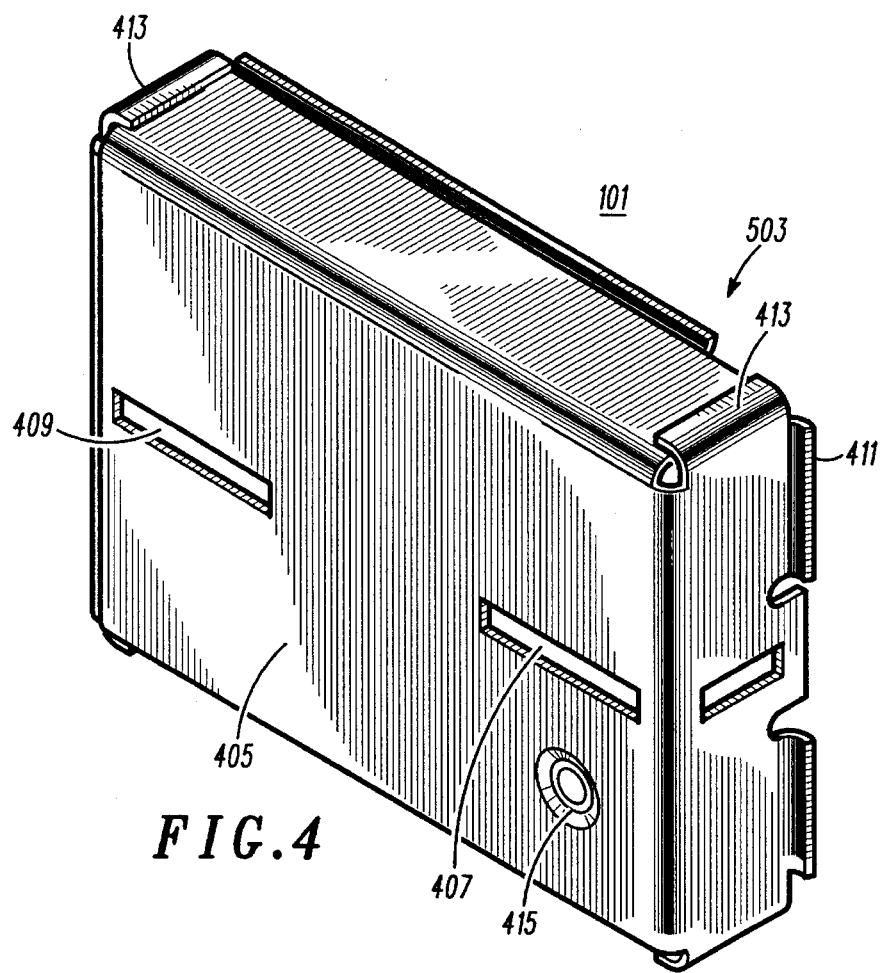
FIG. 4 is a rotational diagram of a preferred embodiment of the enclosure depicted in FIG. 1.

Referring To FIG. 4 among others, the plurality of mounting edges (503) including a first mounting edge (411) is depicted. The mounting edges are fabricated during the forming operation for the enclosure by forming a 0.2 mm typical radius across the mounting edge. Additionally, the first and second side walls (105, 107) includes a rounded corner that enhances the shielding effectiveness of the electromagnetic shield by eliminating a gap that would otherwise be present at the corner of the enclosure (101). Further a dimple (415) is provided. The dimple facilitates automated assembly operations providing for vision enhanced manufacturing processes when the shield is assembled to the carrier.

Figure 5A:
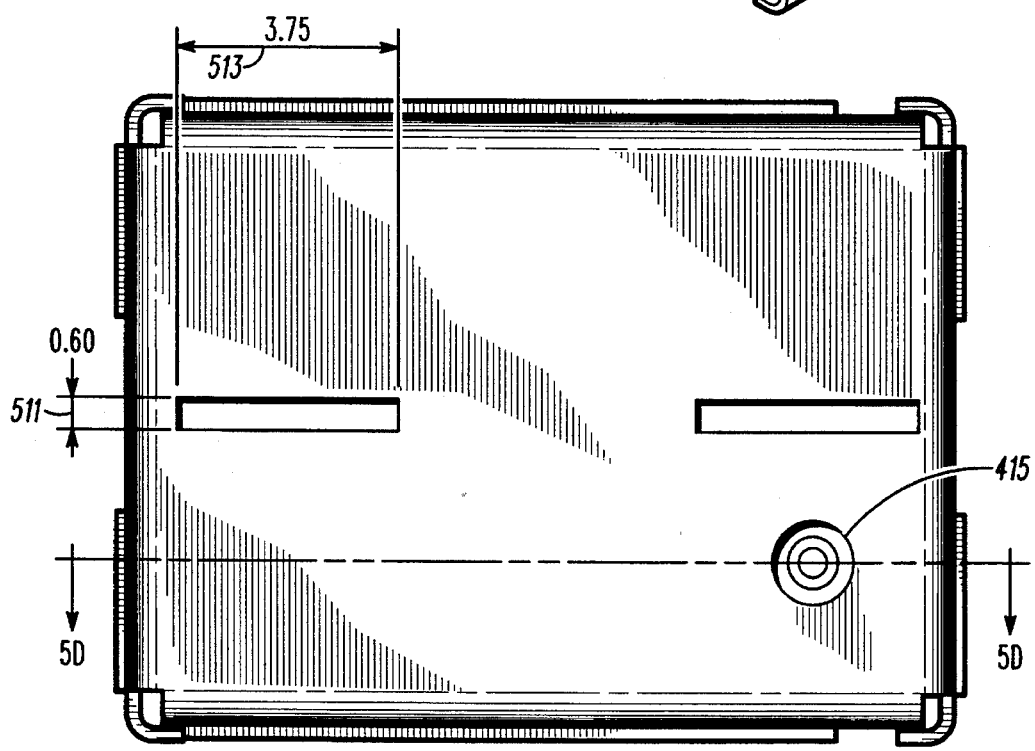
FIG. 5A is a front detailed diagram of the preferred embodiment of the enclosure depicted in FIG. 1.
Figure 5B:
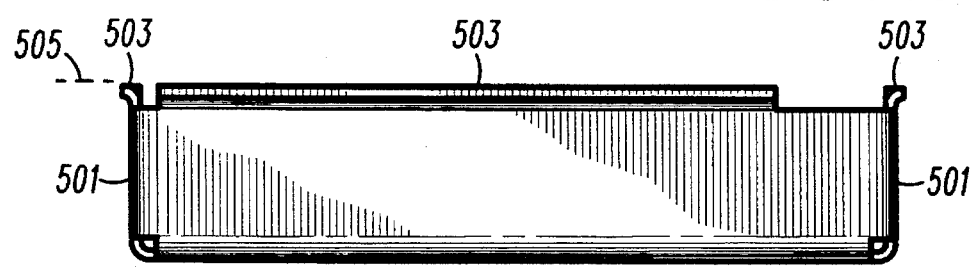
FIG. 5B is a top side diagram of the preferred embodiment of the enclosure depicted in FIG. 5A.
Figure 5C:
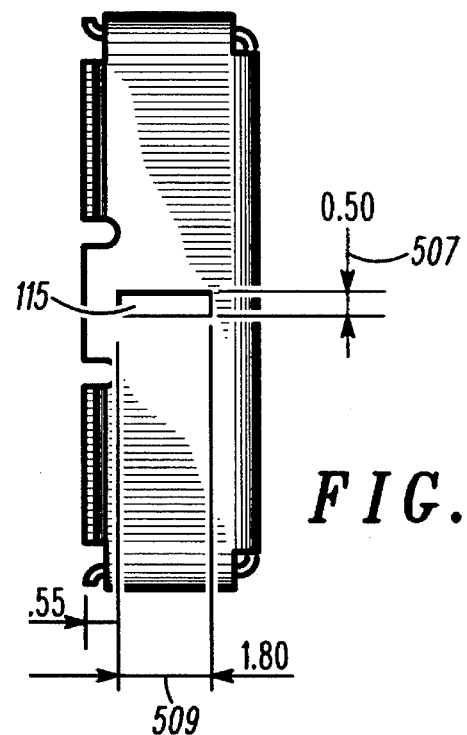
FIG. 5C is a cross section diagram of the preferred embodiment of the enclosure depicted in FIG. 5A.
Figure 5D:
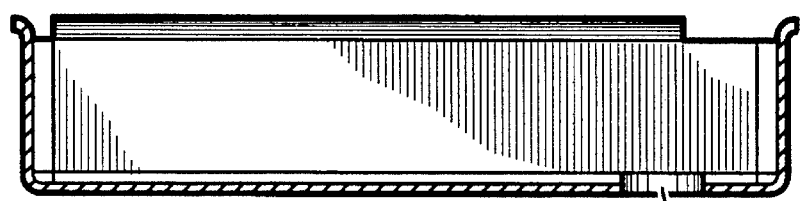
FIG. 5D is a left side diagram of a preferred embodiment of the enclosure depicted in FIG. 5A.

FIGS. 5A–5D depicts various dimensioned drawings of the preferred embodiment of the enclosure (101) including a front or top detailed diagram of the enclosure in FIG. 5A, a top side diagram of the enclosure in FIG. 5B, a cross section diagram in FIG. 5C of the enclosure depicted in FIG. 5A through the dimple (415) and a left side diagram of the enclosure in FIG. 5D.

Given the overall dimensions of the electromagnetic shield (100) of approximately 14.4 by 10.6 mm the final component is readily supplied in tape and real format suitable for automated assembly operations. Additionally the flat first surface (405) facilitates automated pick and place manufacturing equipment. More importantly the floating partition provides improved coplanarity by essentially allowing an additional degree of freedom and further avoiding any deformation of the enclosure that may otherwise occur if spot welding is used to locate and captivate the partition. The additional degree of freedom results from separating the enclosure portion of the shield from the partition element and requiring a given coplanarity specification, specifically 0.1 mm per 25 mm, for each independent of the other.

It will be appreciated by those of ordinary skill in the art that the apparatus and methods disclosed provide a cost effective electromagnetic shield that complies with required coplanarity specifications and lends itself to reduced size automated surface mount assembly operations. This inventive shield may be readily and advantageously employed in automated surface mount assembly operations, without otherwise sacrificing shielding effectiveness, component count or size, or economic considerations. Hence, the present invention, in furtherance of satisfying a long-felt need in the field facilitates an electromagnetic shield having improved coplanarity along with the other attributes known to be desirable in state of the art assembly operations.

It will be apparent to those skilled in the art that the disclosed invention may be modified in numerous ways and may assume many embodiments other than the preferred form specifically set out and described above. For example while one embodiment of the partition and the enclosure has been discussed others of greater geometric complexity clearly exist. Accordingly, it is intended by the appended claims to cover all modifications of the invention which fall within the true spirit and scope of the invention.

What is claimed is:

1. A multi compartment electromagnetic energy shield arranged for assembly to a mounting surface of a carrier, the multi compartment electromagnetic energy shield comprising in combination:

an enclosure having electromagnetic shielding properties and further including a first surface and a first and a second side wall each extending from said first surface to the mounting surface of the carrier after surface mount assembly to the mounting surface of the carrier; and a partition having electromagnetic shielding properties and a mounting edge, said partition arranged and constructed to electromagnetically divide said enclosure into multiple compartments, said partition captivated by said first and said second side wall in a free floating manner such that said mounting edge coincides with said mounting surface after surface mount assembly to the mounting surface of the carrier.

2. The multi compartment electromagnetic energy shield of claim 1 wherein said first side wall further includes a captivating slot.

3. The multi compartment electromagnetic energy shield of claim 2 wherein said partition further includes a captivating tab arranged to free float within said captivating slot.

4. The multi compartment electromagnetic energy shield of claim 1 wherein said enclosure further includes a locating slot and said partition further includes a locating tab, said locating tab arranged to free float within said locating slot.

5. The multi compartment electromagnetic energy shield of claim 4 wherein said first side wall further includes a captivating slot.

6. The multi compartment electromagnetic energy shield of claim 5 wherein said partition further includes a captivating tab arranged to free float within said captivating slot.

7. An electromagnetic shield having improved coplanarity properties and arranged for assembly to a planer surface of a carrier, comprising in combination;

an enclosure having electromagnetic shielding properties, a closed side, and a plurality of walls each extending from said closed side and culminating at a corresponding plurality of mounting edges to collectively form a mounting plane, said mounting plane substantially coincident with the planer surface during assembly of the electromagnetic shield to the carrier a partition having electromagnetic shielding properties and a mounting edge, said partition captivated in a free floating manner by a portion of said plurality of walls such that said edge coincides with the planer surface during the assembly of the electromagnetic shield to the carrier.

8. The multi compartment electromagnetic energy shield of claim 7 wherein said portion of said plurality of walls further include a captivating slot.

9. The multi compartment electromagnetic energy shield of claim 8 wherein said partition further includes a captivating tab arranged to free float within said captivating slot.

10. The multi compartment electromagnetic energy shield of claim 7 wherein said enclosure further includes a locating slot and said partition further includes a locating tab, said locating tab arranged to free float within said locating slot.

11. The multi compartment electromagnetic energy shield of claim 10 wherein said portion of said plurality of walls further includes a captivating slot.

12. The multi compartment electromagnetic energy shield of claim 11 wherein said partition further includes a captivating tab arranged to free float within said captivating slot.

* * * * *